US006589830B1

(12) United States Patent
Zeng

(10) Patent No.: US 6,589,830 B1
(45) Date of Patent: Jul. 8, 2003

(54) SELF-ALIGNED PROCESS FOR FABRICATING POWER MOSFET WITH SPACER-SHAPED TERRACED GATE

(75) Inventor: Jun Zeng, Mountaintop, PA (US)

(73) Assignee: Fairchild Semiconductor Corporation, South Portland, ME (US)

( * ) Notice: Subject to any disclaimer, the term of this patent is extended or adjusted under 35 U.S.C. 154(b) by 63 days.

(21) Appl. No.: 09/665,850

(22) Filed: Sep. 20, 2000

(51) Int. Cl.[7] .............................................. H01L 21/338
(52) U.S. Cl. ........................ 438/182; 438/209; 438/212; 438/238; 438/358
(58) Field of Search .................................. 438/182, 268, 438/138, 238, 350, 212, 209, 210, 202, 286, 306, 164, 358, 207, 533, 234, 328

(56) References Cited

U.S. PATENT DOCUMENTS

| 5,510,281 | A | * | 4/1996 | Ghezzo et al. ............... 438/268 |
| 5,814,859 | A | * | 9/1998 | Ghezzo et al. ............... 257/335 |
| 6,186,408 | B1 | * | 2/2001 | Rodov et al. ................. 238/268 |
| 6,331,455 | B1 | * | 12/2001 | Rodov et al. ................. 438/138 |

OTHER PUBLICATIONS

Ishikawa, Osamu, et al., "A High–Power High–Gain VD–MOSFET Operating at 900 MHz", *IEEE Transactions On Electron Devices*, vol. ED. 34, No. 5., May 1987 (pp. 1157–1161).

Shenai, Krishna, "Optimally Scaled Low–Voltage Vertical Power MOSFET's for High–Frequency Power Conversion", *IEEE Transactions On Electron Devices*, vol. 37, No. 4, Apr. 1990 (pp. 1141)–1153).

Ueda, Daisuke et al., "A New Vertical Double Diffused MOSFET—The Self–Aligned Terraced–Gate MOSFET", *IEEE Transactions On Electron Devices*, vol. ED 31, No. 4, Apr. 1984 (pp. 416–420).

* cited by examiner

Primary Examiner—Matthew Smith
Assistant Examiner—Igwe W. Anya
(74) Attorney, Agent, or Firm—Thomas R. FitzGerald, Esq.

(57) ABSTRACT

A process forms a power semiconductor device with reduced input capacitance and improved switching speed. A substrate with an epitaxial has an oxide layer patterned to form a narrow terraced gate. A gate oxide layer is formed on the upper surface of the epitaxial layer. A layer of polysilicon is deposited on the narrow terraced gate oxide region and the gate oxide layer. The polysilicon layer is anisotropically etched to form polysilicon spacers abutting each of the two side surfaces of the narrow terraced gate region. A p-type dopant is implanted through the gate oxide layer and the polysilicon spacers and is driven in to form P-well regions in the epitaxial layer. A source mask is formed and an n-type dopant is implanted through the gate oxide layer and the polysilicon spacers. It is driven in to form N+ source regions in the P-well regions.

39 Claims, 6 Drawing Sheets

SELF-ALIGNED PROCESS FOR FABRICATING POWER MOSFET WITH SPACER-SHAPED TERRACED GATE

FIELD OF THE INVENTION

The present invention relates to power semiconductor devices, more particularly, to MOSFET devices suitable for high frequency power conversion or RF applications, and to a process for making such devices.

BACKGROUND OF THE INVENTION

The semiconductor industry is witnessing an increasing demand for DC-DC converters with low output voltage, very fast transient response, and high efficiency that can be advantageously used for high frequency power conversion. When the operating frequency reaches 1 MHz or higher, the power losses of a synchronous buck DC-DC converter will be dominated by the switching losses of output power MOSFETs. It is well known that most switching losses in a power MOSFET occur during charging/discharging the drain-gate capacitance, the so-called "Miller effect." Reducing drain-source feedback capacitance, referred to as "Miller capacitance," is an important approach to improving DC-DC converter efficiency. In addition, decreasing or completely eliminating Miller capacitance would dramatically improve the RF performance of the device. Conceptually, Miller capacitance can be substantially decreased by removing the polysilicon layer overlying the neck region, or by increasing the thickness of the oxide layer underneath the polysilicon layer in the neck region. These concepts are discussed in, for example, the following publications: K. Shenai, "Optimally scaled low-voltage vertical power MOSFETs for high-frequency power conversion" in *IEEE Trans. Electron Dev.*, 1990, Vol. 37, No. 4, pp 1141–1153; O. Ishikawa and H. Esaki, "A high-power high-gain VD-MOSFET operating at 900 MHz" in *IEEE Trans. Electron Dev.*, 1987, Vol. 34, No. 5, pp 1157–1161; and D. Ueda, H. Takagi, and G. Kano, "A new vertical double diffused MOSFET—The Self-Aligned Terraced-Gate MOSFET" in *IEEE Trans. Electron Dev.*, 1984, Vol. 31, No. 4, pp 416–420. The disclosures of these papers are incorporated herein by reference.

Realizing the concepts discussed in the cited papers is a formidable fabrication challenge, requiring a multiplicity of masks, non-self aligned photolithographic steps, and non-standard processing steps. It would be highly desirable to devise a cost-effective, readily manufacturable self-aligned process for the fabrication of power MOSFETs with low Miller capacitance. This goal is met by the process of the present invention.

SUMMARY OF THE INVENTION

A process for forming a power semiconductor device with reduced input capacitance and improved switching speed comprises: providing a semiconductor substrate that includes an n-doped layer of epitaxially grown silicon, and forming a thick oxide layer on an upper surface of the epitaxial layer. Prior to formation of the thick oxide layer, a thin pad oxide layer is optionally grown on the epitaxial layer. The thick oxide layer is patterned to form a narrow terraced gate oxide region having a top surface and two side surfaces on the epitaxial layer upper surface. A gate oxide layer is formed on the upper surface of the epitaxial layer, and a layer of polysilicon is deposited on the narrow terraced gate oxide region and the gate oxide layer. The polysilicon layer is anisotropically etched to form tapered polysilicon spacers abutting each of the two side surfaces of the narrow terraced gate region.

A p-type dopant is implanted through the gate oxide layer and a tapered portion of the polysilicon spacers, and the dopant is driven to form P-well regions in the epitaxial layer at its upper surface. A source mask is formed on the epitaxial layer upper surface, and an n-type dopant is implanted through the gate oxide layer and a tapered portion of the polysilicon spacers, then driven to form $N^+$ source regions in the P-well regions.

The process of the present invention further comprises: removing the source mask and forming a passivation layer on the polysilicon spacers, the top surface of the narrow terraced gate region, and the gate oxide layer overlying the epitaxial layer upper surface. Following removal of portions of the passivation layer and the gate oxide layer overlying the P-well and $N^+$ source regions to form P-well and $N^+$ source contact regions, a metal layer is formed that is in contact with the P-well and $N^+$ source contact regions and with a gate contact region.

In another embodiment, the process of the present invention further comprises: removing the source mask and the polysilicon spacers from the epitaxial layer upper surface, and depositing a layer of gate metal on the narrow terraced gate oxide region and the gate oxide layer. The gate metal layer is anisotropically etched to form tapered metal spacers abutting each of the two side surfaces of the narrow terraced gate region, and a passivation layer is formed on the metal spacers, the top surface of the narrow terraced gate region, and the gate oxide layer overlying the epitaxial layer upper surface. Portions of the passivation layer and gate oxide layer overlying the P-well and $N^+$ source regions are removed to form P-well and $N^+$ source contact regions, and a metal layer is formed that is in contact with the P-well and $N^+$ source contact regions and with a gate contact region.

DETAILED DESCRIPTION OF THE INVENTION

Figure 1:
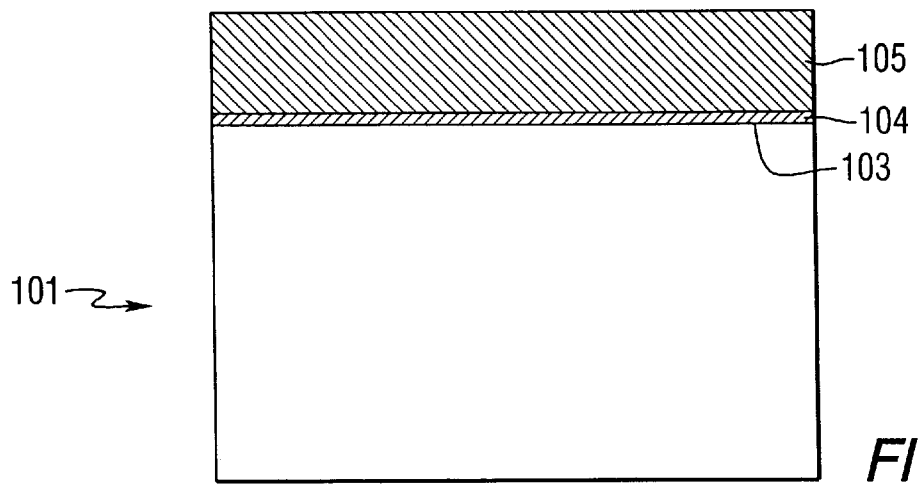
FIGS. 1–9 schematically depict the steps employed in the process of the present invention.

The process of the present invention is illustrated by FIGS. 1–9. In FIG. 1 is shown a semiconductor substrate 101 that includes an n-doped epitaxially grown silicon layer 102. On upper surface 103 of epitaxial layer 102 is a thermally grown pad oxide layer 104, on which is formed a thick oxide layer 105, which can comprise field oxide (FOX). Alternatively, the field oxide can be removed from the device active area, and a thick oxide layer 105 comprising low temperature oxide (LTO) or undoped silicon glass (USG) can be formed thereon. Oxide layer 105 has a thickness preferably of about 0.4 μm to about 1.5 μm, more preferably, about 0.8 μm.

Figure 2:
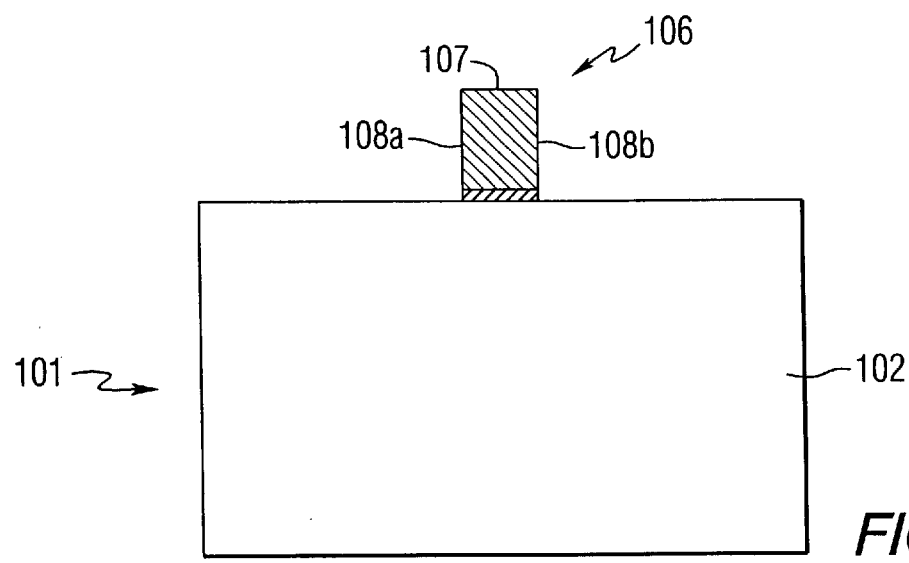
Figure 3:
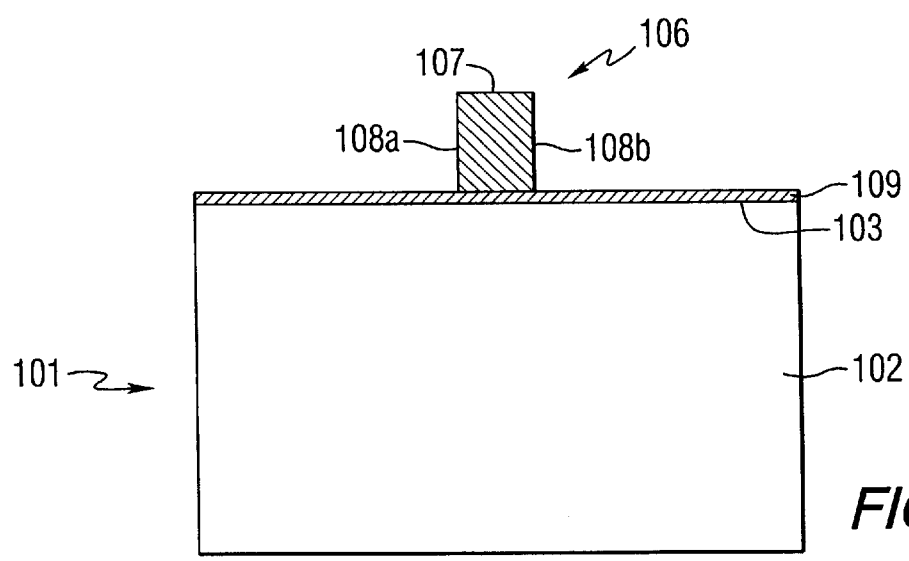

As shown in FIG. 2, thick oxide layer 105 is patterned by masking and anisotropic etching, for example, reactive ion etching, to form a narrow terraced gate oxide region 106 having a top surface 107 and two side surfaces 108a and 108b. Following formation of terraced gate oxide region 106, a gate oxide layer 109 is formed on epitaxial layer upper surface 103, as depicted in FIG. 3.

Figure 4:
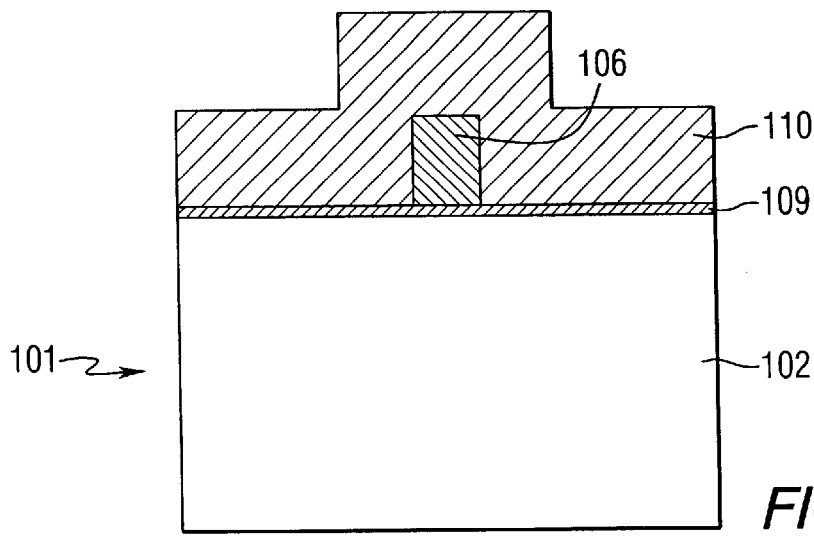
Figure 5:
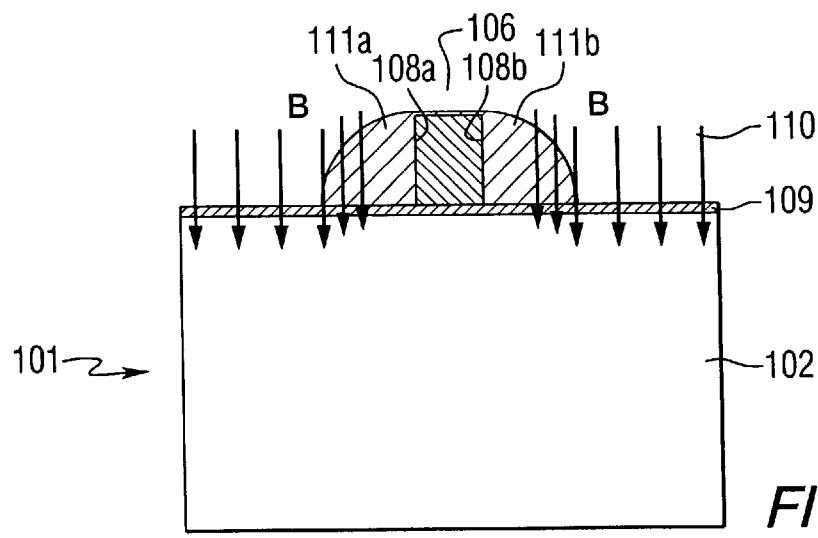
Figure 6:
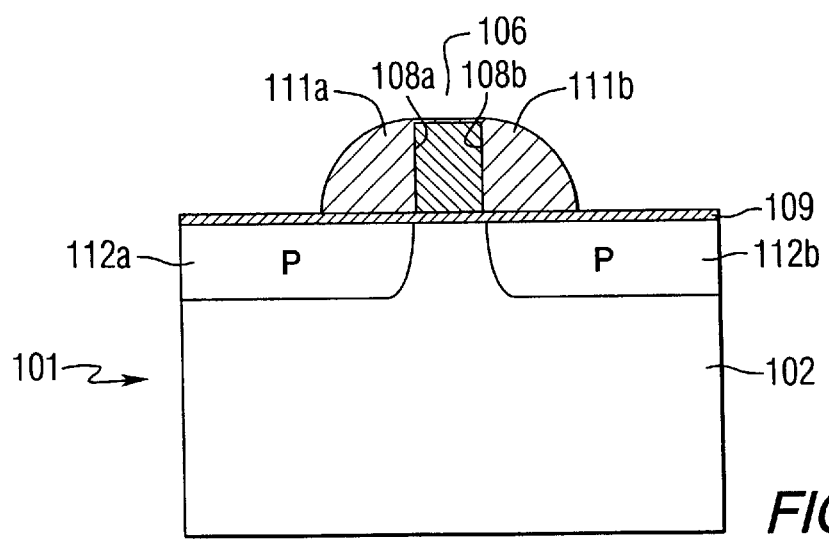

FIG. 4 illustrates the deposition of polysilicon layer 110 on terraced gate oxide region 106 and gate oxide layer 109, and FIG. 5 depicts the anisotropic etching of layer 110 to form polysilicon spacers 111a and 111b abutting side surfaces 108a and 108b, respectively, of terraced gate oxide region 106. A p-type dopant, boron, for example, is implanted at a dose of about $1\times10^{13}$ to $2\times10^{14}$ atoms/cm$^2$ at about 10 to 120 KeV through gate oxide layer 109 and a tapered portion of polysilicon spacers 111a and 111b into epitaxial layer 102. The sloping sides of spacers 111a–b enables automatic channel doping modulation. Driving of the boron dopant results in formation of P-well regions 112a and 112b, as shown in FIG. 6. It should be noted that the process of the present invention results in complete self-alignment of terraced gate oxide region 106, polysilicon spacers 111a and 111b, and P-well regions 112a and 112b.

Figure 7:
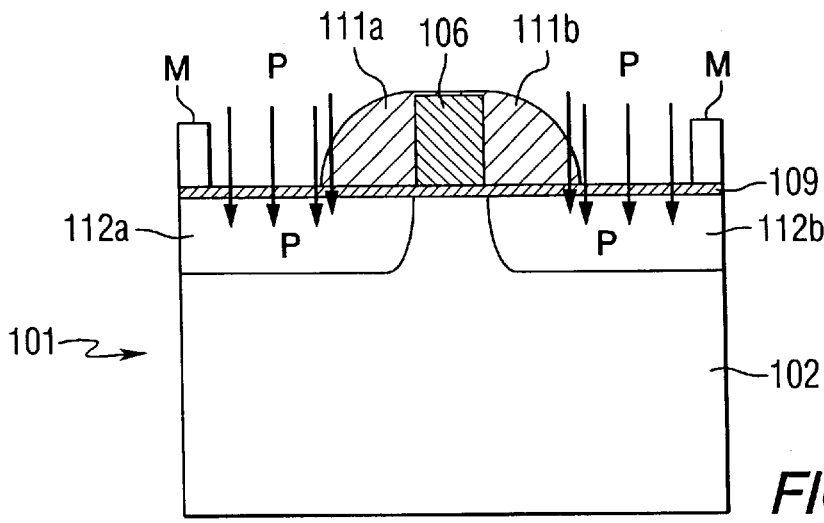

Following formation of a photoresist source mask M, as shown in FIG. 7, an n-type dopant such as phosphorus, arsenic, or mixtures thereof is implanted at a dose of about $1\times10^{15}$ to $2\times10^{16}$ atoms/cm$^2$ at about 10 to 120 KeV through gate oxide layer 109 and a tapered portion of polysilicon spacers 111a and 111b into P-well regions 112a and 112b. Annealing results in the formation of N$^+$ source regions 113a and 113b in P-well regions 112a and 112b, respectively, as depicted in FIG. 8.

Figure 9:
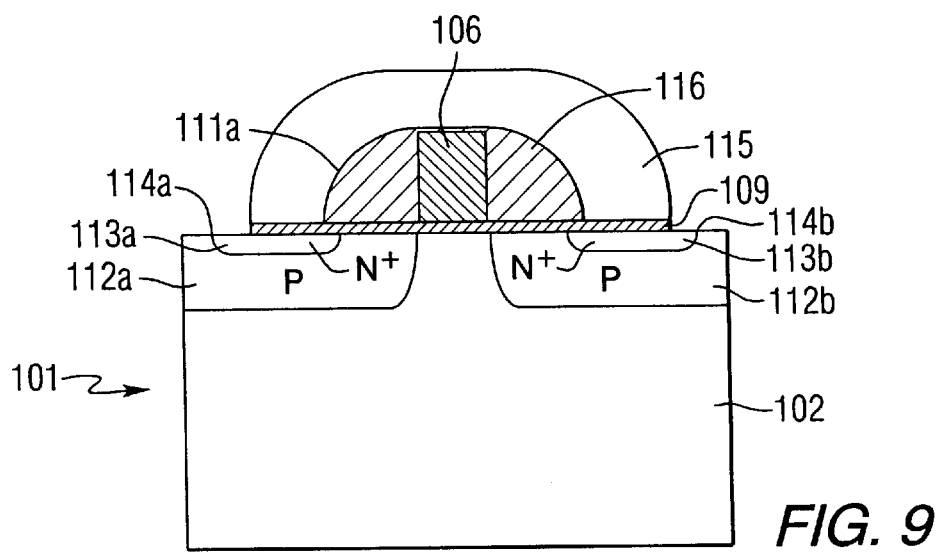

FIG. 9 illustrates the Following removal of source mask M, a passivation layer 115 such as borophosphosilicate glass (BPSG) is formed on polysilicon spacers 111a–b, on top surface 107 of narrow terraced gate region 106, and on gate oxide layer 109. The tapered form of polysilicon spacers 111a–b eliminates the need for the reflow treatment of BPSG that is typically required if the gate polysilicon is in the form of a planar layer with sharp edges. Portions of gate oxide layer 109 and passivation layer 115 overlying P-well regions 112a–b and N$^+$ source regions 113a–b are then removed to form P-well and N$^+$ source contact regions 114a and 114b.

Figure 8:
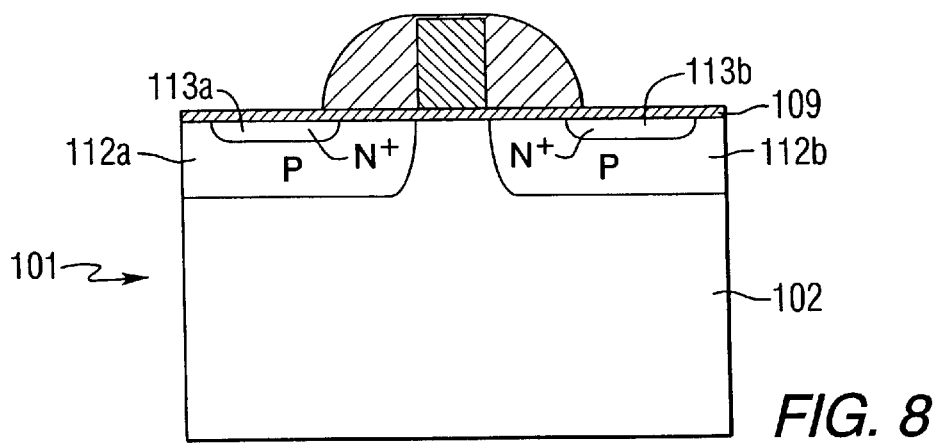
Figure 10:
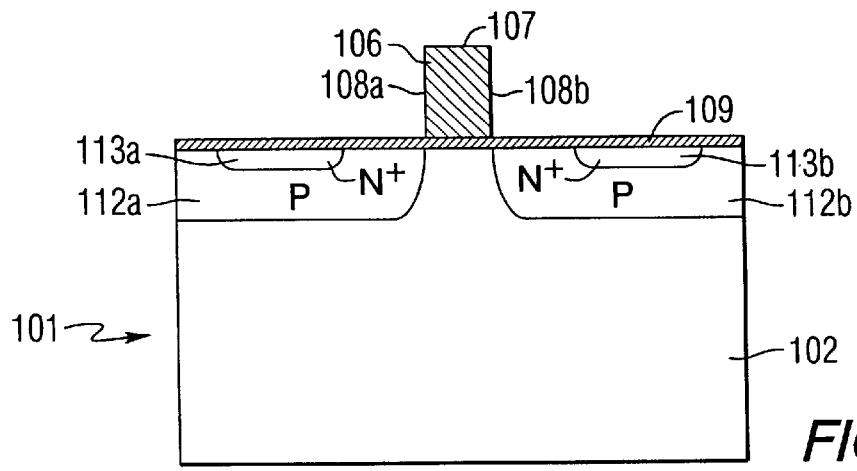
FIGS. 10–12 depict further steps in the process of the invention.
Figure 11:
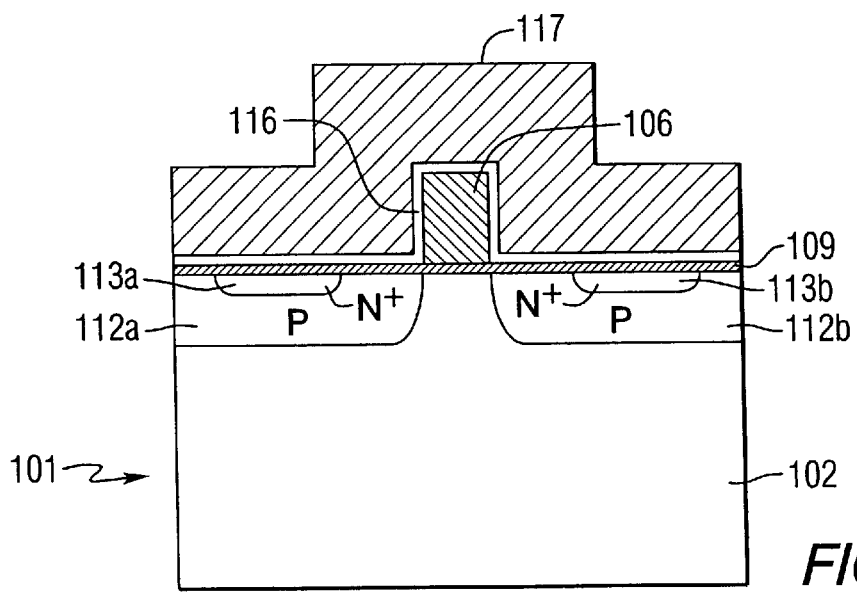
Figure 12:
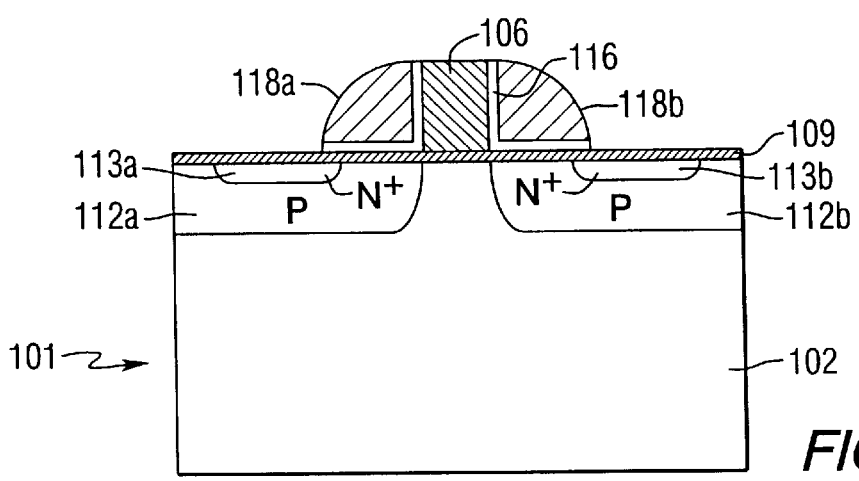

FIGS. 10–12 illustrate alternative steps, starting with the structure depicted in FIG. 8, of the process of the present invention. In FIG. 10 is depicted the removal of polysilicon spacers 111a and 111b from their positions abutting narrow terraced gate region 106. Optionally, to repair possible damage to gate oxide layer 109 during removal of spacers 111a and 111b, layer 109 may be removed and regrown. FIG. 11 depicts the optional formation of a barrier layer 116, for example, titanium or titanium nitride, on terraced gate region 107 and gate oxide layer 109. A layer 117 of gate metal, for example, aluminum, molybdenum, or tungsten, is formed on optional barrier layer 116 or on terraced gate oxide region 107 and gate oxide layer 109. As shown in FIG. 12, gate metal layer 117 is anisotropically etched to form metal spacers 118a and 118b abutting side surfaces 108a and 108b, respectively, of narrow terraced gate region 107.

It will be noted that the structure depicted in FIG. 12, except for the use of metal rather than polysilicon in gate spacers 118a–b and the inclusion of optional barrier layer 116, is the same as that shown in FIG. 8. The use of metal rather than polysilicon provides additional further advantages to devices formed by the process of the present invention: a very large reduction in gate signal propagation equivalent series resistance (ESR), and a greatly enhanced transient response during on/off switching of the device. The metal spacers also substantially improve the RF performance of the device.

Figure 13:
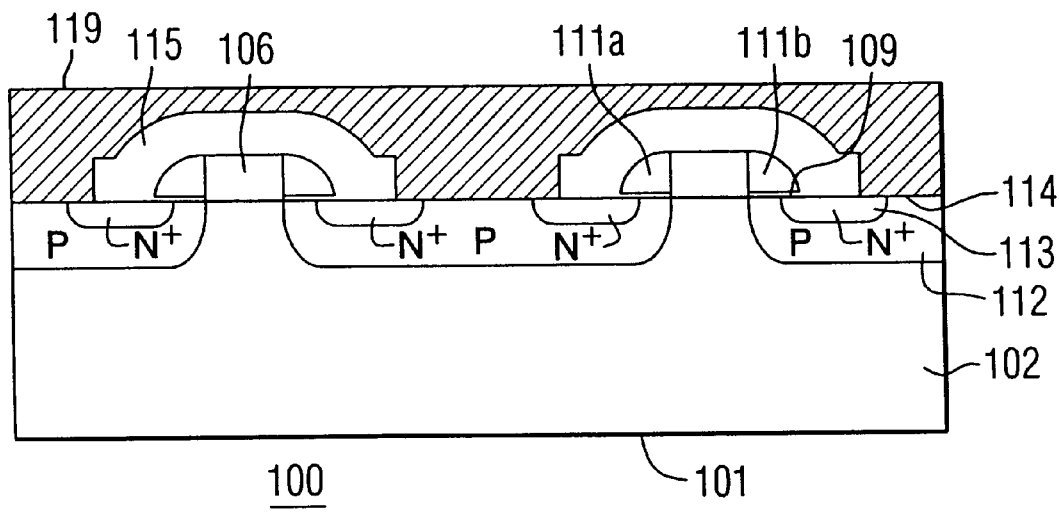
FIGS. 13 and 14 are computer-simulated cross-sectional views of, respectively, a power semiconductor device formed by the process of the present invention and a prior art device.

FIG. 13 is a computer-simulated cross-section of a power semiconductor device 100 formed by the process of the present invention. Device 100 includes a substrate 101 having an n-doped epitaxial layer 102, a narrow terraced gate oxide region 106, gate oxide layer 109, tapered polysilicon spacers 111a–b, P-well regions 112, N$^+$ source regions 113, well and source contact regions 114, and passivation layer 115. As already noted, polysilicon spacers 111a–b can be replaced by tapered metal spacers 118a–b. Metal layer 119 is formed to provide contact with P-well and N$^+$ source contact regions 114 and with a gate contact region (not shown). Formation of a backside metal layer (not shown) completes the fabrication, in accordance with the present invention, of device 100.

Figure 14:
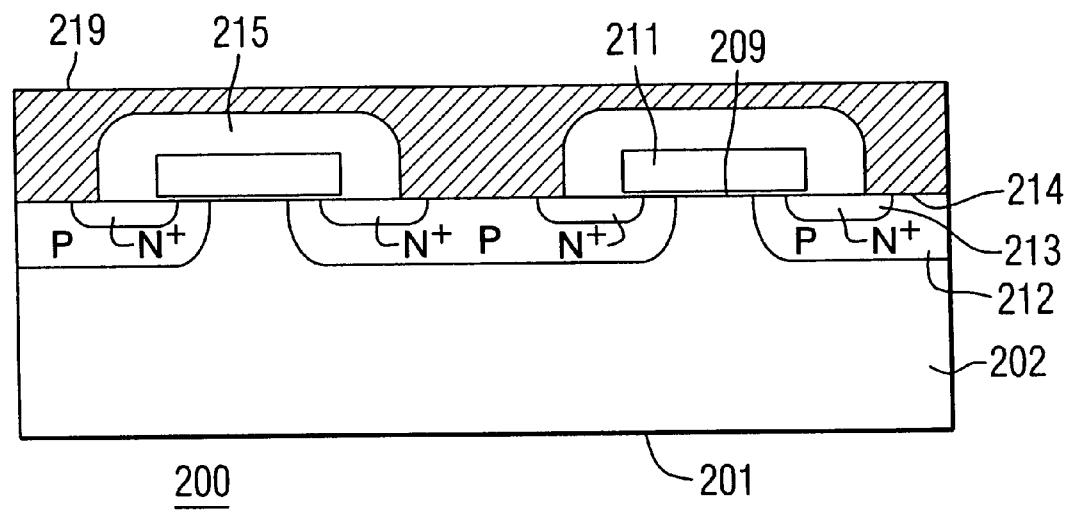

FIG. 14 is a computer-simulated cross-section of a prior art power semiconductor device 200 analogous to device 100 formed in accordance with the present invention. Device 200 includes a substrate 201 having an n-doped epitaxial layer 202, gate oxide layer 209, gate polysilicon 211, P-well regions 212, N$^+$ source regions 213, well and source contact regions 214, and passivation layer 215. Metal layer 219 is formed to provide contact with P-well and N$^+$ source contact regions 214 and with a gate contact region (not shown). Formation of a backside metal layer (not shown) completes the fabrication of prior art device 200.

Figure 15:
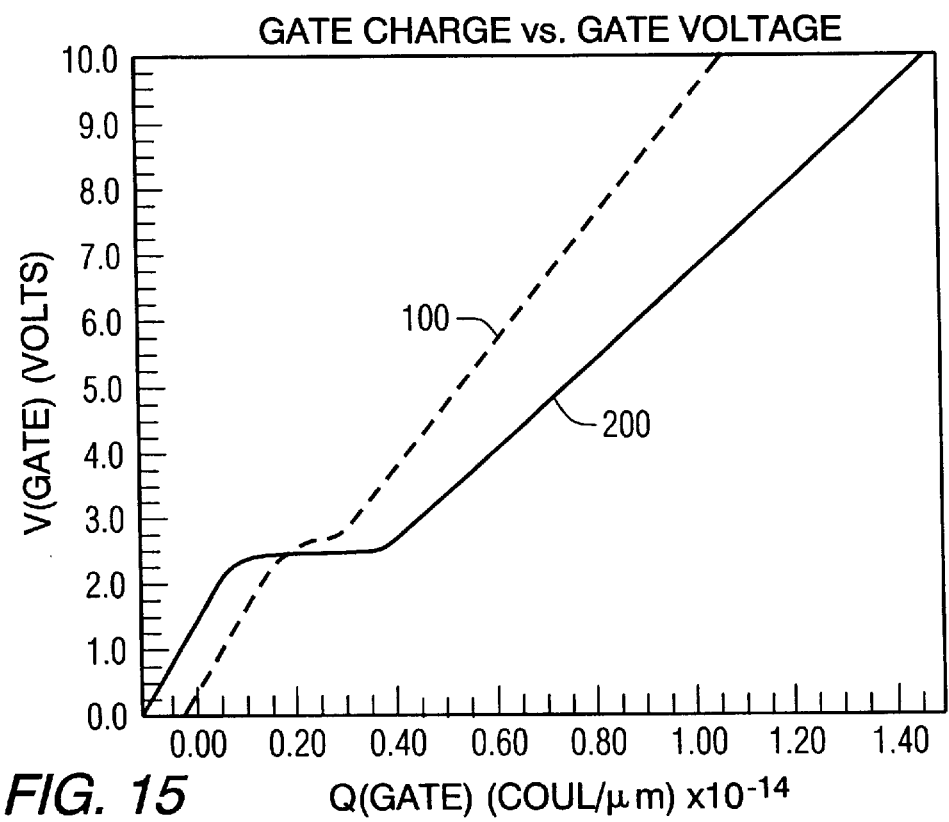
FIGS. 15 and 16 are plots of, respectively, gate charge vs gate voltage and gate voltage vs time for computer simulations of the electrical performance of a device formed by the process of the present invention and a prior art device.
Figure 16:
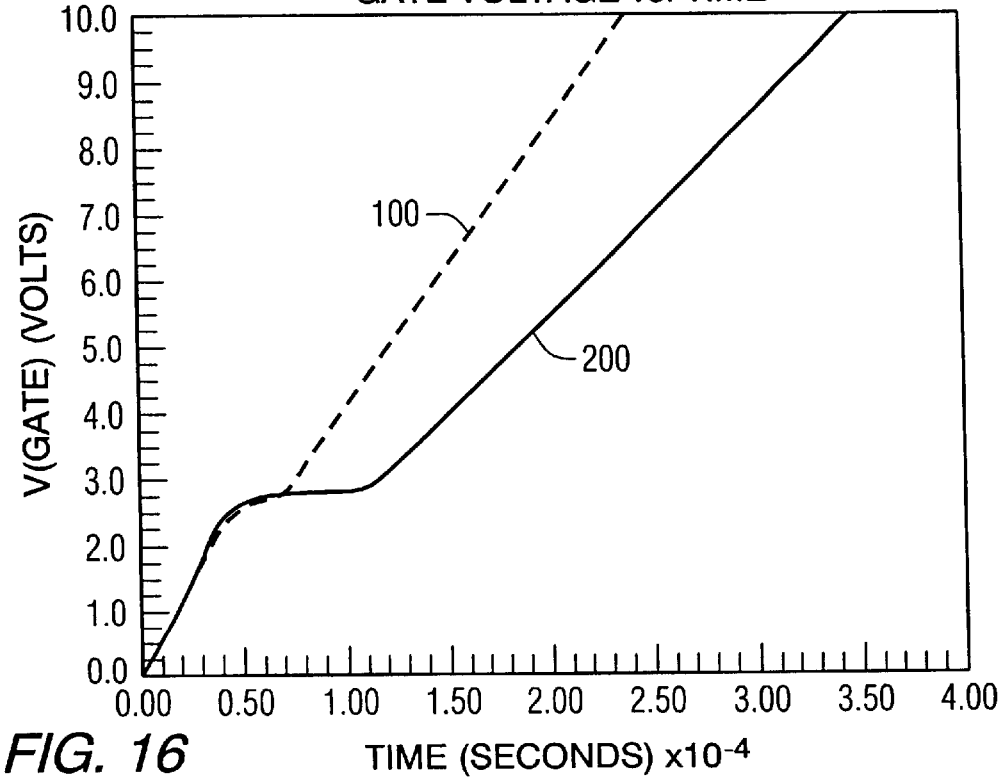

Computer simulation was employed to compare the electrical performance of devices 100 and 200, using the same design rules and a cell pitch of 7.0 μm for each device. FIG. 15 contains plots of gate charge as a function of gate voltage for device 100 of the invention and for prior art device 200. Comparison of the plots makes clear that the "Miller" charge, which is defined as the width of the plateau in the curve, is dramatically reduced for device 100 relative to device 200. Consequently, the switching speed of device 100 is very much faster than that of device 200, as is clearly evident from the plots, included in FIG. 16, of gate voltage as a function of time for the two devices.

The simulated data obtained for device 100 of the present invention and prior art device 200 are summarized in TABLE 1. Although the threshold voltage, $V_{th}$, and specific on-resistance, $R_{sp}$, are almost identical for both devices, the "Miller" charge, $Q_{gd}$, of device 100 is 56% lower than that of device 200. Device 100 also has lower total input capacitance than device 200, as demonstrated by the large difference in slope of the curves in FIGS. 15 and 16. The drain-source breakdown voltage, $V_{dsbr}$, of device 100 is slightly lower than that of device 200 because of the presence of the thick terraced gate oxide interrupting the gate polysilicon in device 100. The reduction of polysilicon area in the latter device may increase the gate equivalent series resistance (ESR), which can be compensated by increasing the polysilicon dopant concentration. Also, as previously noted, substitution of metal for polysilicon in the gate spacers results in a very large reduction in ESR.

TABLE 1

| Device | $V_{th}$ (V) | $R_{sp}$ @ 10 V (mohm.cm$^2$) | $V_{dsbr}$ (V) | $Q_{gd}$ (nC/cm$^2$) |
|---|---|---|---|---|
| 100 | 1.76 | 0.55 | 32 | 41 |
| 200 | 1.77 | 0.58 | 35 | 93 |

The invention has been described in detail for the purpose of illustration, but it is to be understood that such detail is solely for that purpose, and variations can be made therein by those skilled in the art without departing from the spirit and scope of the invention, which is defined by the claims that follow.

What is claimed is:

1. A process for forming a power semiconductor device with reduced input capacitance and improved switching speed, said process comprising:

providing a semiconductor substrate comprising a layer of n-doped epitaxially grown silicon;

forming a thick oxide layer on an upper surface of said epitaxial layer;

patterning said thick oxide layer, thereby forming a narrow terraced gate oxide region on said upper surface of said epitaxial layer, said narrow terraced gate oxide region having a top surface and two side surfaces;

forming a gate oxide layer on said upper surface of said epitaxial layer;

depositing a layer of polysilicon on said narrow terraced gate oxide region and said gate oxide layer;

anisotropically etching said polysilicon layer, thereby forming tapered polysilicon spacers abutting each of said two side surfaces of said narrow terraced gate oxide region;

implanting a p-type dopant through said gate oxide layer and a tapered portion of said polysilicon spacers, and driving said p-type dopant in said epitaxial layer, thereby forming p-well regions in said epitaxial layer at its upper surface; and forming a source mask on said epitaxial layer upper surface, implanting an n-type dopant through said gate oxide layer and a tapered portion of said polysilicon spacers, and driving said n-type dopant in said P-well regions, thereby forming $N^+$ source regions in said P-well regions.

2. The process of claim 1 further comprising:

removing said source mask, and forming a passivation layer on said polysilicon spacers, on said top surface of said narrow terraced gate oxide region, and on said gate oxide layer overlying said epitaxial layer upper surface;

removing portions of said passivation layer and said gate oxide layer overlying said P-well and $N^+$ source regions, thereby forming P-well and $N^+$ source contact regions; and forming a metal layer in contact with said P-well and $N^+$ source contact regions and with a gate contact region.

3. The process of claim 2 wherein said passivating layer is borophosphosilicate glass (BPSG).

4. A power semiconductor device formed by the process of claim 2.

5. The process of claim 1 further comprising:

removing said source mask and said polysilicon spacers from said epitaxial layer upper surface;

depositing a layer of gate metal on said narrow terraced gate oxide region and said gate oxide layer;

anisotropically etching said gate metal layer, thereby forming tapered metal spacers abutting each of two side surfaces of said narrow terraced gate region;

forming a passivation layer on said metal spacers, on said top surface of said narrow terraced gate region, and on said gate oxide layer overlying said epitaxial layer upper surface;

removing portions of said passivation layer and said gate oxide layer overlying said P-well and $N^+$ source regions, thereby forming P-well and N source contact regions; and forming a metal layer in contact with said P-well and $N^{30}$ source contact regions and with a gate contact region.

6. The process of claim 5 wherein said gate metal is selected from the group consisting of aluminum, molybdenum, and tungsten.

7. The process of claim 5 further comprising:

prior to depositing said layer of gate metal, forming a barrier layer on said narrow terraced gate oxide region and said gate oxide layer.

8. The process of claim 7 wherein said barrier layer comprises titanium or titanium nitride.

9. A power semiconductor device formed by the process of claim 5.

10. The process of claim 1 further comprising:

prior to forming said thick oxide layer, growing a thin pad oxide layer on an upper surface of said epitaxial layer.

11. The process of claim 5 further comprising:

in addition to removing said source mask and said polysilicon spacers, removing said gate oxide layer from said epitaxial layer upper surface; and forming a new gate oxide layer on said epitaxial layer upper surface.

12. The process of claim 1 wherein said thick oxide layer comprises an oxide selected from the group consisting of field oxide (FOX), low temperature oxide (LTO) and undoped silicon glass (USG).

13. The process of claim 1 wherein said thick oxide layer has a thickness of about 0.4 $\mu$m to about 1.5 $\mu$m.

14. The process of claim 13 wherein said thick oxide layer has a thickness of about 0.8 $\mu$m.

15. The process of claim 1 wherein said p-type dopant is boron.

16. The process of claim 1 wherein said p-type dopant is at a dose of about $1 \times 10^{14}$ atoms/cm$^2$ at about 10 to 120 KeV.

17. The process of claim 1 wherein said n-type dopant is phosphorus, arsenic or a mixture thereof.

18. The process of claim 1 wherein said n-type dopant is a dose of about $1 \times 10^{15}$ to $2 \times 10^{16}$ atoms/cm$^2$ at about 10 to 120 KeV.

19. A power semiconductor device formed by the process of claim 1.

20. The process of claim 1 further comprising:

removing said source mask, and forming a passivation layer on said polysilicon spacers, on said top surface of said marrow terraced gate region, and on said gate oxide layer overlying said epitaxial layer upper surface;

removing portions of said passivation layer and gate oxide layer overlying said well and source contact regions; and forming a metal layer in contact with said well and source contact regions and with a gate contact region.

21. The process of claim 20 wherein said passivating layer is borophosphosilicate glass (BPSG).

22. A power semiconductor device formed by the process of claim 20.

23. A process for forming a power semiconductor device with reduced input capacitance and improved switching speed, said process comprising:

providing a semiconductor substrate comprising a layer of n-doped epitaxially grown silicon;

forming a thick oxide layer on an upper surface of said epitaxial layer;

patterning said thick oxide layer, thereby forming a narrow terraced gate oxide region on said upper surface of said epitaxial layer, said narrow terraced gate oxide region having a top surface and two side surfaces;

forming a gate oxide layer on said upper surface of said epitaxial layer;

depositing a layer of polysilicon on said narrow terraced gate oxide region and said gate oxide layer;

anisotropically etching said polysilicon layer, thereby forming tapered polysilicon spacers abutting each of said two side surfaces of said narrow terraced gate oxide region;

implanting a dopant of a first polarity through said gate oxide layer and a tapered portion of said polysilicon spacers, and driving said first polarity dopant in said epitaxial layer, thereby forming well regions in said epitaxial layer at its upper surface; and forming a source mask on said epitaxial layer upper surface, implanting a dopant of a second polarity through said gate oxide layer and a tapered portion of said polysilicon spacers, and driving said dopant of the second polarity in said well regions, thereby forming heavily doped source regions in said well regions.

24. The process of claim 23 further comprising:

removing said source mask and said polysilicon spacers from said epitaxial layer upper surface;

depositing a layer of gate metal on said narrow terraced gate oxide region and said gate oxide layer;

anisotopically etching said gate metal layer, thereby forming tapered metal spacers abutting each of two side surfaces of said narrow terraced gate oxide region;

forming a passivation layer on said metal spacers, on said top surface of said narrow terraced gate oxide region, and on said gate oxide layer overlying said epitaxial layer upper surface;

removing portions of said passivation layer and said gate oxide layer overlying said well and source regions, thereby forming well and source contact regions; and forming a metal layer in contact with said well and source contact regions and with a gate contact region.

25. The process of claim 24 wherein said gate metal is selected from the group consisting of aluminum, molybdenum and tungsten.

26. The process of claim 24 further comprising:

in addition to removing said source mask and said polysilicon spacers, removing said gate oxide layer from said epitaxial layer upper surface; and forming a new gate oxide layer on said epitaxial layer upper surface.

27. The process of claim 24 further comprising:

prior to depositing said layer of gate metal, forming a barrier layer on said narrow terraced gate oxide region and said gate oxide layer.

28. The process of claim 27 wherein said barrier layer comprises titanium or titanium nitride.

29. A power semiconductor device formed by the process of claim 24.

30. The process of claim 23 further comprising:

prior to forming said thick oxide layer, growing a thin pad oxide layer on an upper surface of said epitaxial layer.

31. The process of claim 23 wherein said thick oxide layer comprises an oxide selected from the group consisting of field oxide (FOX), low temperature oxide (LTO) and undoped silicon glass (USG).

32. The process of claim 23 wherein said thick oxide layer has a thickness of about 0.4 $\mu$m to about 1.5 $\mu$m.

33. The process of claim 32 wherein said thick oxide layer has a thickness of about 0.8 $\mu$m.

34. The process of claim 23 wherein said first polarity type dopant is boron.

35. The process of claim 27 wherein said first polarity type dopant is at a dose of about $1\times10^{14}$ atoms/cm$^2$ at about 10 to 120 KeV.

36. The process of claim 23 wherein said second type polarity dopant is phosphorus, arsenic or a mixture thereof.

37. The process of claim 23 wherein said second polarity type dopant is a dose of about $1\times10^{15}$ to $2\times10^{16}$ atoms/cm$^2$ at about 10 to 120 KeV.

38. The process of claim 23 wherein the first polarity type dopant is n-type and the second polarity type dopant is p-type.

39. A power semiconductor devise formed by the process of claim 23.

* * * * *

UNITED STATES PATENT AND TRADEMARK OFFICE
CERTIFICATE OF CORRECTION

PATENT NO. : 6,589,830 B1  Page 1 of 1
DATED : July 8, 2003
INVENTOR(S) : Jun Zeng It is certified that error appears in the above-identified patent and that said Letters Patent is hereby corrected as shown below:

Column 8,
Line 39, delete "devise" to be replaced with -- device --.

Signed and Sealed this

Fourteenth Day of October, 2003

JAMES E. ROGAN
*Director of the United States Patent and Trademark Office*